United States Patent
Read (10) Patent No.: US 7,923,056 B2
(45) Date of Patent: Apr. 12, 2011

(54) METHOD AND APPARATUS FOR DISPENSING MATERIAL ON A SUBSTRATE

(75) Inventor: Hugh R. Read, Amesbury, MA (US)

(73) Assignee: Illinois Tool Works Inc., Glenview, IL (US)

( * ) Notice: Subject to any disclaimer, the term of this patent is extended or adjusted under 35 U.S.C. 154(b) by 511 days.

(21) Appl. No.: 12/054,621

(22) Filed: Mar. 25, 2008

(65) Prior Publication Data
US 2008/0296311 A1 Dec. 4, 2008

Related U.S. Application Data

(63) Continuation-in-part of application No. 11/809,590, filed on Jun. 1, 2007, now Pat. No. 7,833,572.

(51) Int. Cl.
*B05D 1/26* (2006.01)
(52) U.S. Cl. ............................ 427/8; 427/261
(58) Field of Classification Search ............... 427/8, 256
See application file for complete search history.

(56) References Cited

U.S. PATENT DOCUMENTS

| | | | |
|---|---|---|---|
| 3,777,197 A | 12/1973 | Preston et al. | |
| 5,747,102 A | 5/1998 | Smith et al. | |
| 5,938,871 A * | 8/1999 | Nakahira et al. | 156/64 |
| 6,007,631 A | 12/1999 | Prentice et al. | |
| 6,093,251 A | 7/2000 | Carr et al. | |
| 6,206,964 B1 | 3/2001 | Purcell et al. | |
| 6,224,675 B1 | 5/2001 | Prentice et al. | |
| 6,322,854 B1 | 11/2001 | Purcell et al. | |
| 6,395,334 B1 | 5/2002 | Prentice et al. | |
| 6,541,063 B1 * | 4/2003 | Prentice et al. | 427/8 |
| 7,100,147 B2 | 8/2006 | Miller et al. | |
| 2006/0177564 A1 | 8/2006 | Diaz et al. | |
| 2006/0193969 A1 | 8/2006 | Prentice et al. | |
| 2008/0296315 A1 | 12/2008 | Read | |

FOREIGN PATENT DOCUMENTS

| | | |
|---|---|---|
| DE | 3805841 A1 | 8/1989 |
| EP | 1 806 962 A2 | 7/2007 |
| JP | 5-90799 | 4/1993 |

OTHER PUBLICATIONS

Patent Abstracts of Japan, JP 05 090799 (TDK Corp.), Apr. 9, 1993.

(Continued)

*Primary Examiner* — Frederick J Parker
(74) *Attorney, Agent, or Firm* — Lando & Anastasi, LLP (57) ABSTRACT

A dispensing apparatus includes a frame, a support coupled to the frame, a gantry coupled to the frame, a first dispensing unit coupled to the gantry, a second dispensing unit coupled to the gantry, and an imaging system coupled to one of the frame and the gantry. The imaging system may be configured to capture at least one image of a first pattern and a second pattern, with the second pattern being identical to the first pattern. The dispensing apparatus further includes a controller configured to verify whether the first pattern and the second pattern are properly positioned on the support with respect to one another based on the at least one captured image to permit simultaneous dispense operations of the first dispensing unit on the first pattern and the second dispensing unit on the second pattern. Other embodiments and methods of dispensing are further disclosed.

17 Claims, 6 Drawing Sheets

OTHER PUBLICATIONS

Patent Abstracts of Japan, JP 05 185004 (Toshiba Corp.), Jul. 27, 1993.
Patent Abstracts of Japan, JP 63 270574 (Matsushita Electric Ind. Co. Ltd.), Nov. 8, 1988.
Patent Abstracts of Japan, JP 08 024749 (TDK Corp.), Jan. 30, 1996.
International Search Report for PCT/US2008/063514 mailed Sep. 19, 2008.
English translation of Japanese Patent Publication No. JP5-90799 (Kanai), Apr. 9, 1993.
International Search Report for PCT/US2009/033518 mailed Jun. 18, 2009.

* cited by examiner

METHOD AND APPARATUS FOR DISPENSING MATERIAL ON A SUBSTRATE

RELATED APPLICATION

This application is a continuation-in-part of U.S. patent application Ser. No. 11/809,590, filed Jun. 1, 2007, entitled METHOD AND APPARATUS FOR DISPENSING A VISCOUS MATERIAL ON A SUBSTRATE, which is currently pending and incorporated herein by reference for all purposes.

BACKGROUND OF THE INVENTION

1. Field of the Invention

The present disclosure relates generally to methods and apparatus for dispensing a viscous material on a substrate, such as a printed circuit board, and more particularly to a method and an apparatus for dispensing material on a substrate with enhanced efficiency.

2. Discussion of Related Art

There are several types of prior art dispensing systems used for dispensing precise amounts of liquid or paste for a variety of applications. One such application is the assembly of integrated circuit chips and other electronic components onto circuit board substrates. In this application, automated dispensing systems are used for dispensing dots of liquid epoxy or solder paste, or some other related material, onto circuit boards. Automated dispensing systems are also used for dispensing lines of underfill materials and encapsulents, which may be used to mechanically secure components to the circuit board. Exemplary dispensing systems described above include those manufactured and distributed by Speedline Technologies, Inc. of Franklin, Mass.

In a typical dispensing system, a pump and dispenser assembly is mounted to a moving assembly or gantry for moving the pump and dispenser assembly along three mutually orthogonal axes (X, Y, Z) using servomotors controlled by a computer system or controller. To dispense a dot of liquid on a circuit board or other substrate at a desired location, the pump and dispenser assembly is moved along the co-planar horizontal X and Y axes until it is located over the desired location. The pump and dispenser assembly is then lowered along the perpendicularly oriented vertical Z axis until a nozzle/needle of the pump and dispenser assembly is at an appropriate dispensing height over the substrate. The pump and dispenser assembly dispenses a dot of liquid, is then raised along the Z axis, moved along the X and Y axes to a new location, and is lowered along the Z axis to dispense the next liquid dot. For applications such as encapsulation or underfilling as described above, the pump and dispenser assembly is typically controlled to dispense lines of material as the pump and dispenser are moved in the X and Y axes along the desired path of the lines.

The production rate of such dispensing systems, in some cases, may be limited by the rate at which a particular dispense pump assembly can accurately and controllably dispense dots or lines of material. In other cases, the production rate of such systems may be limited by the rate at which parts can be loaded into and out of the machine. In still other cases, the production rate of such systems may be limited by process requirements, such as the time required to heat a substrate to a particular temperature, or the time required for a dispensed material to flow, as in underfill applications. In all cases and applications, there is some limit to the throughput capability of a single dispense system.

During the manufacture of integrated circuits, production requirements often exceed the throughput capabilities of a single dispensing system. To overcome the throughput limitations of a single dispensing system, various strategies are applied to improve the production process.

SUMMARY OF THE INVENTION

One aspect of the invention is directed to a dispensing apparatus for dispensing viscous material on an electronic substrate. In a certain embodiment, the dispensing apparatus comprises: a frame; a support coupled to the frame to receive electronic substrates; a first dispensing unit configured to dispense viscous material; a second dispensing unit configured to dispense viscous material; a gantry coupled to the frame, the gantry comprising a first Z drive mechanism configured to support the first dispensing unit, the first Z drive mechanism being configured to lower the first dispensing unit toward a first electronic substrate pattern when performing a dispense operation, and a second Z drive mechanism configured to support the second dispensing unit, the second Z drive mechanism being configured to lower the second dispensing unit toward a second electronic substrate pattern when performing a dispense operation, wherein the second Z drive mechanism is capable of being adjusted relative to the first Z drive mechanism a predetermined distance; and a controller configured to control a dispense operation of the first dispensing unit on the first electronic substrate pattern and a dispense operation of the second dispensing unit on the second electronic substrate pattern.

Embodiments of the dispensing apparatus may include a vision system coupled to the gantry to align the first dispensing unit with the first electronic substrate and the second dispensing unit with the second electronic substrate. In one embodiment, the first and second dispensing unit each comprises a non-contact-type dispensing unit. In a certain embodiment, the non-contact-type dispensing unit is configured to stream viscous material onto the electronic substrate. In another embodiment, the non-contact-type dispensing unit is configured to launch viscous material at a location on the electronic substrate.

Another aspect of the invention is directed to a method of dispensing viscous material on an electronic substrate comprising: delivering a first electronic substrate pattern to a dispense position; delivering a second electronic substrate pattern to a dispense position; aligning the first electronic substrate pattern with a first dispensing unit; positioning the second dispensing unit a predetermined distance from the first dispensing unit; dispensing material from the first dispensing unit at desired locations on the first electronic substrate pattern; and dispensing material from the second dispensing unit at desired locations on the second electronic substrate pattern.

Embodiments of the invention may include dispensing material from the first dispensing unit by lowering the first dispensing unit toward the first electronic substrate pattern and/or dispensing material from the second dispensing unit by lowering the second dispensing unit toward the second electronic substrate pattern.

Yet another aspect of the invention is directed to a method of dispensing viscous material on an electronic substrate comprising: delivering first and second electronic substrate patterns to respective dispense positions; positioning a first dispensing unit over the first electronic substrate pattern; positioning a second dispensing unit a predetermined distance from the first dispensing unit; dispensing material from the first dispensing unit at desired locations on the first electronic substrate pattern, wherein dispensing material from the first dispensing unit comprises lowering the first dispensing unit toward the first electronic substrate pattern; and dispensing material from the second dispensing unit at desired locations on the second electronic substrate pattern, wherein dispensing material from the second dispensing unit comprises, lowering the second dispensing unit toward the second electronic substrate pattern.

Embodiments of the invention may include determining the predetermined distance by identifying a first point of reference associated with the first electronic substrate pattern and a second point of reference associated with the second electronic substrate pattern.

A further aspect of the invention is directed to a method of dispensing viscous material on an electronic substrate comprising the following steps: (1) identifying positions of fiducial locations on first and second electronic substrates; (2) positioning a second dispensing unit a predetermined distance from a first dispensing unit based on the fiducial locations; (3) moving the first dispensing unit to a first dispense location on a first electronic substrate; (4) dispensing at the first dispense location on the first electronic substrate; (5) moving the second dispensing unit to a first dispense location on the second electronic substrate; (6) dispensing at the first dispense location on the second electronic substrate; and (7) repeating steps (3) through (6) for each remaining dispense location on the first and second electronic substrates.

Embodiments of the invention may further include calibrating a distance between first and second dispensing units and a camera. In one embodiment, steps (4) and (6) occur without contacting the electronic substrate. In a certain embodiment, steps (4) and (6) are achieved by using a non-contact-type dispensing unit configured to stream viscous material onto the electronic substrate. In another embodiment, steps (4) and (6) are achieved by using a non-contact-type dispensing unit configured to launch viscous material at a location on the electronic substrate. Steps (3) and (5) may be achieved by a gantry capable of moving a dispensing unit in X axis and Y axis directions, in which the gantry is incapable of moving the dispensing unit in a Z axis direction.

One aspect of the disclosure is directed to a dispensing apparatus comprises a frame, a support coupled to the frame, the support being configured to support at least one electronic substrate, a gantry coupled to the frame, a first dispensing unit coupled to the gantry, the first dispensing unit being configured to dispense material, a second dispensing unit coupled to the gantry, the second dispensing unit being configured to dispense material, an imaging system coupled to one of the frame and the gantry, the imaging system being configured to capture at least one image of a first pattern and a second pattern, the second pattern being identical to the first pattern, and a controller configured to verify whether the first pattern and the second pattern are properly positioned on the support with respect to one another based on the at least one captured image to permit simultaneous dispense operations of the first dispensing unit on the first pattern and the second dispensing unit on the second pattern.

Embodiments of the dispensing apparatus may include the gantry comprising at least one Z drive mechanism configured to support and lower the first dispensing unit and the second dispensing unit when performing a dispense operation with at least one of the first dispensing unit and the second dispensing unit. In one embodiment, the at least one Z drive mechanism comprises a first Z drive mechanism configured to support the first dispensing unit, the first Z drive mechanism being configured to lower the first dispensing unit toward the first pattern when performing a dispense operation, and a second Z drive mechanism configured to support the second dispensing unit, the second Z drive mechanism being configured to lower the second dispensing unit toward the second pattern when performing a dispense operation. The second dispensing unit is capable of being adjusted a predetermined distance from the first dispensing unit based on the at least one captured image. In a certain embodiment, the first and second dispensing units may each comprise a non-contact-type dispensing unit. In another embodiment, the non-contact-type dispensing unit is configured to stream or launch material onto the electronic substrate.

Another aspect of the disclosure is directed to a dispensing apparatus comprising a gantry, at least two dispensing units coupled to the gantry, each of the at least two dispensing units including a non-contact-type dispensing unit configured to dispense material, an imaging system coupled to the gantry, the imaging system being configured to capture at least one image of a first pattern and a second pattern, the second pattern being identical to the first pattern, and a controller configured to verify whether the first pattern and the second pattern are properly positioned on the support with respect to one another based on the at least one captured image to permit simultaneous dispense operations of the first dispensing unit on the first pattern and the second dispensing unit on the second pattern.

Embodiments of the dispensing apparatus may include configuring the non-contact-type dispensing unit to stream material onto the electronic substrate. In another embodiment, the non-contact-type dispensing unit is configured to launch material at a location on the electronic substrate.

A further aspect of the disclosure is directed to a method of dispensing material comprising: delivering an electronic substrate to a dispense position, the electronic substrate having at least two identical patterns; capturing at least one image of the at least two patterns; and determining whether the at least two patterns are properly positioned to perform simultaneous dispense operations on the at least two patterns based on the captured image.

Embodiments of the method may include, when the at least two patterns are not properly positioned, performing a first dispense operation on a first pattern of the at least two patterns and performing a second dispense operation on a second pattern of the at least two patterns. In one embodiment, the second dispense operation is performed after the first dispense operation. If the at least two patterns are properly positioned, dispense operations may be simultaneously performed on the at least two patterns. A first dispensing unit may be positioned over a first location of a first pattern and a second dispensing unit may be positioned over a first location of a second pattern. Dispense operations may be performed with the first and second dispensing units. In a certain embodiment, the second dispensing unit is spaced from the first dispensing unit a predetermined distance. In yet another embodiment, material may be dispensed from the first and second dispensing units on respective first locations of the first and second patterns. The arrangement is such that the first dispensing unit may be moved over a second location of the first pattern and the second dispensing unit may be moved over a second location of the second pattern of the electronic substrate. Material may be dispensed from the first and second dispensing units on respective second locations of the first and second patterns. When dispensing material from the first dispensing unit, the first dispensing unit may be lowered toward the first pattern. Similarly, when dispensing material from the second dispensing unit, the second dispensing unit may be lowered toward the second pattern.

In yet another aspect of the disclosure, a method of dispensing material comprises the following steps: (1) identifying positions of more than one location on an electronic substrate; (2) determining whether a dispense location of a first pattern and a dispense location of a second pattern are properly positioned to perform simultaneous dispense operations on the first and second patterns based on the identified positions; (3) if properly positioned, moving a first dispensing unit to a dispense location on the first pattern and moving a second dispensing unit to a dispense location on the second pattern, the dispense location of the first pattern corresponding with the dispense location on the second pattern; (4) simultaneously dispensing at the dispense location on the first pattern with the first dispensing unit and at the dispense location on the second pattern with the second dispensing unit; and (5) repeating steps (3) and (4) for each remaining dispense location on the first and second patterns of the electronic substrate.

Embodiments of the method may include: calibrating a distance between the first and second dispensing units and a camera; performing step (4) without contacting the electronic substrate; performing step (4) by using a non-contact-type dispensing unit configured to at least one of stream and launch material onto the electronic substrate; and performing step (3) by a gantry capable of moving a dispensing unit in X axis and Y axis directions.

The present disclosure will be more fully understood after a review of the following figures, detailed description and claims.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE PREFERRED EMBODIMENTS

For the purposes of illustration only, and not to limit the generality, the disclosure will now be described in detail with reference to the accompanying figures. This disclosure is not limited in its application to the details of construction and the arrangement of components set forth in the following description or illustrated in the drawings. The teachings disclosed herein are capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

As mentioned above, in some cases, multiple independent dispensing systems are sometimes used to increase the production of dispense operations. This solution is often expensive, requiring multiple machines, additional manufacturing space and in some cases multiple machine operators. In typical operations, manufacturing floor space is both limited and expensive. It is therefore desirable to reduce the "footprint" of each manufacturing system on the manufacturing floor and to reduce the number of separate machines that need to be operated and maintained.

For some applications, multiple instances of the same circuit pattern are fabricated on a common substrate. A common example is a circuit pattern for a cell phone, wherein four or more patterns may be disposed on a single substrate. In such cases, there is often a fixed and uniform offset between the multiple instances of the circuit patterns, which may be disposed on a common substrate and separated from one another after completion along perforations. Furthermore, it is known in the industry that a dispensing system with multiple dispensing units or pumps may be utilized to increase throughput. In such systems, the offset distance between the multiple dispensing pumps may be adjusted to be substantially the same as the offset distance between the multiple circuit distances, and if the accuracy of this offset adjustment is within the accuracy requirements of the resultant dispense pattern, then the multiple dispensing pumps can be positioned simultaneously by a single X, Y, Z gantry and operated simultaneously.

When a dispensing system is presented with a substrate or component to be dispensed upon, it is typical that an automatic vision system is used to locate and calibrate the actual position of the part and/or critical features within the part. This locating and calibrating allows the system to compensate for variations in either the substrate or component itself or in the fixing of the substrate or component relative to the coordinate system of the dispensing unit positioning system.

When multiple dispensing units or heads are utilized in parallel to achieve a high collective throughput, e.g., dispensing on two substrates at the same time, it is typical that the multiple dispensing units are programmed to perform substantially the same task on substantially identical components. However, because of slight variations in either the components themselves or in the fixing of the components relative to the positioning systems, corrections may need to be applied independently to each of the multiple dispense units. Since these corrections are unique to each of the multiple dispense units, it is necessary that each of the dispensing units be independently positioned relative to its substrate. Accordingly, dispensers configured with multiple dispensing units are more adapted for coarse dispensing applications in which accurate dispensing is not critical.

One prior art system achieves high throughput by utilizing multiple independent dispensing units and is described in U.S. patent application Ser. No. 09/033,022, filed Mar. 2, 1998, now U.S. Pat. No. 6,007,631, which is incorporated herein by reference. This dispensing system utilizes multiple independent dispensing units or heads. Each of the multiple dispensing units is mounted on a separate positioning system and operates over an independent work area.

One other prior art system achieves high throughput by utilizing multiple units and multiple pallets of parts and is described in provisional U.S. patent application Ser. No. 60/432,483, filed Dec. 11, 2002, now abandoned, and also in U.S. patent application Ser. No. 10/661,830, filed Sep. 12, 2003, now abandoned, both of which are incorporate herein by reference.

It is desirable to achieve at least some of the throughput advantages of the multiple dispense units or heads while still providing the size and cost advantages of a single dispense system. Embodiments of the disclosure described below achieve the throughput advantages of prior art dispensers described above while further reducing the footprint and cost by positioning multiple dispensing units above the surface of the substrates with a common gantry. Specifically, embodiments of the disclosure are directed to dispensing units, methods of dispensing and dispensing systems that contain methods and apparatus of the disclosure. Embodiments of the disclosure can be used with dispensing system platforms offered under the brand name CAMALOT® by Speedline Technologies, Inc. of Franklin, Mass.

Figure 1:
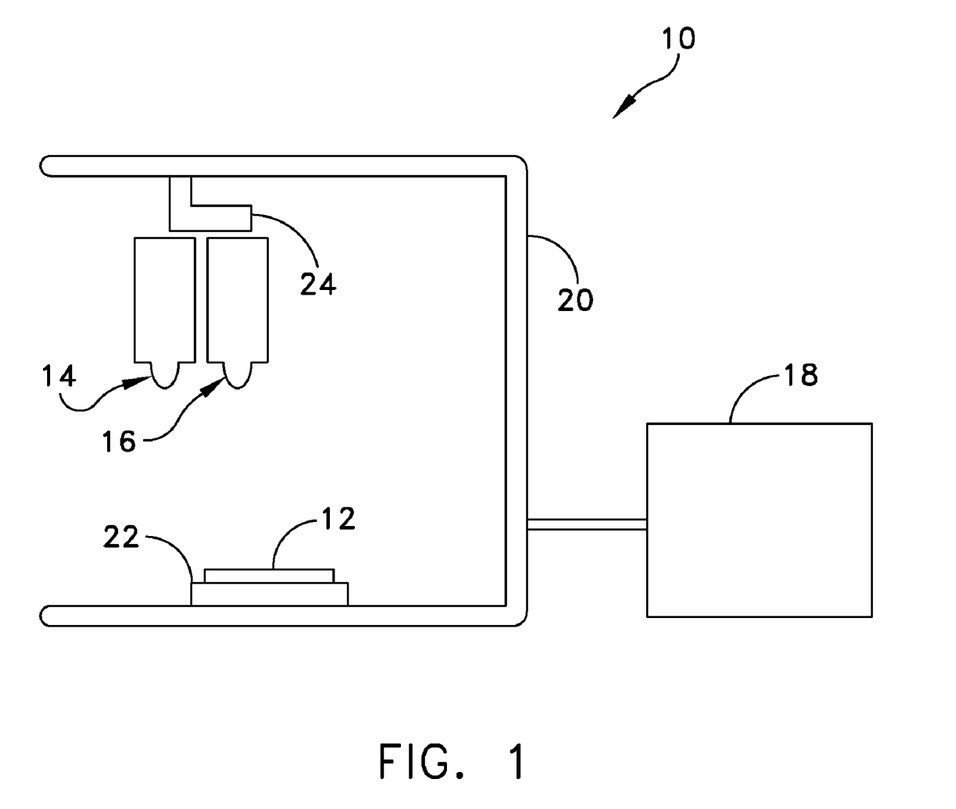
FIG. 1 is a side schematic view of a dispenser.

FIG. 1 schematically illustrates a dispenser, generally indicated at 10, used to dispense a viscous material (e.g., adhesive, encapsulent, epoxy, solder paste, underfill material, etc.) or a semi-viscous material (e.g., soldering flux, etc.), or a substantially non-viscous material (e.g., an ink) onto an electronic substrate 12, such as a printed circuit board or semiconductor wafer. The substrate 12 may embody any type of surface or material upon which dispensing is required. The dispenser 10 includes first and second dispensing units or heads, generally indicated at 14 and 16, respectively, and a controller 18 to control the operation of the dispenser. Although two dispensing units are shown, it should be understood that more than two dispensing units may be provided.

The dispenser 10 also includes a frame 20 having a base 22 for supporting the substrate 12 and a gantry 24 movably coupled to the frame 20 for supporting and moving the dispensing units 14, 16. As is well known in the art of printed circuit board fabrication, a conveyor system (not shown) may be used in the dispenser 10 to control loading and unloading of circuit boards to and from the dispenser. The gantry 24 can be moved using motors under the control of the controller 18 in the X axis and Y axis directions to position the dispensing units at predetermined locations over the circuit board.

Figure 2:
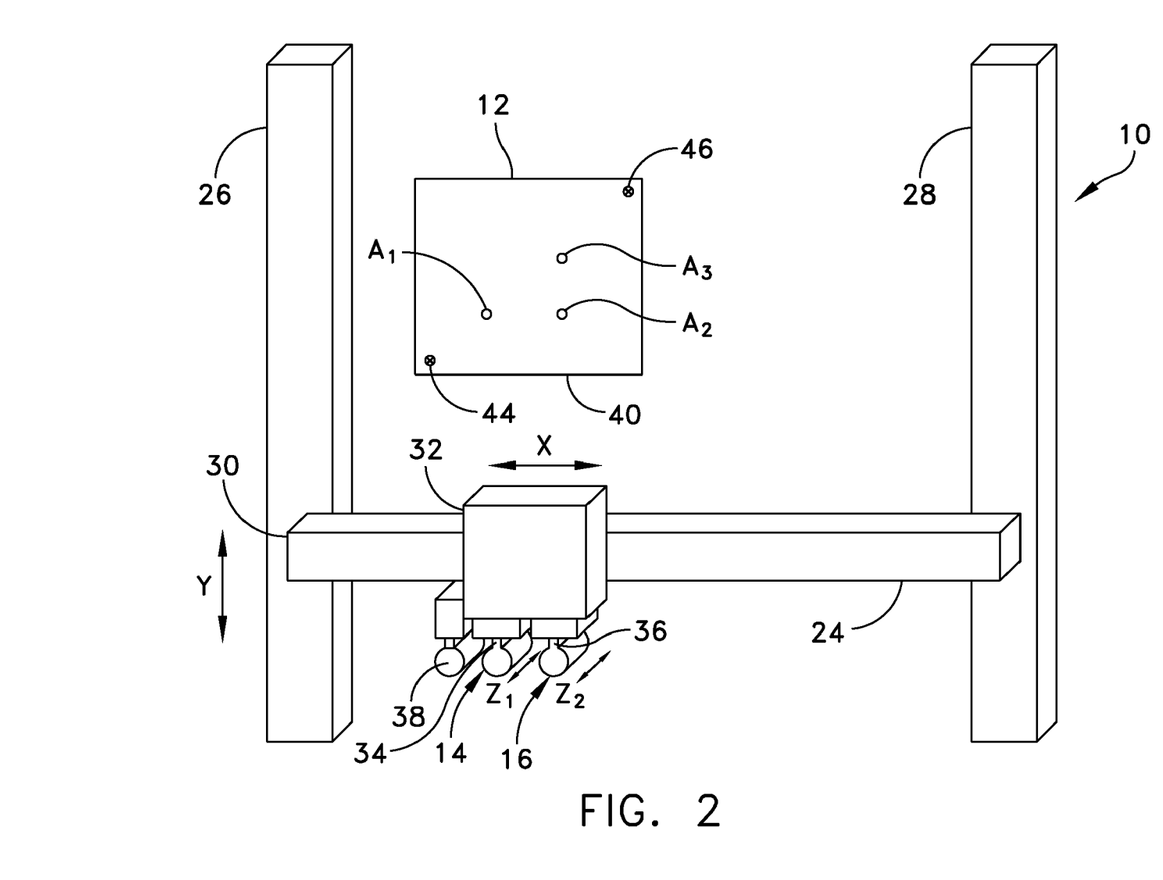
FIGS. 2-4 are schematic views of a dispenser.
Figure 3:
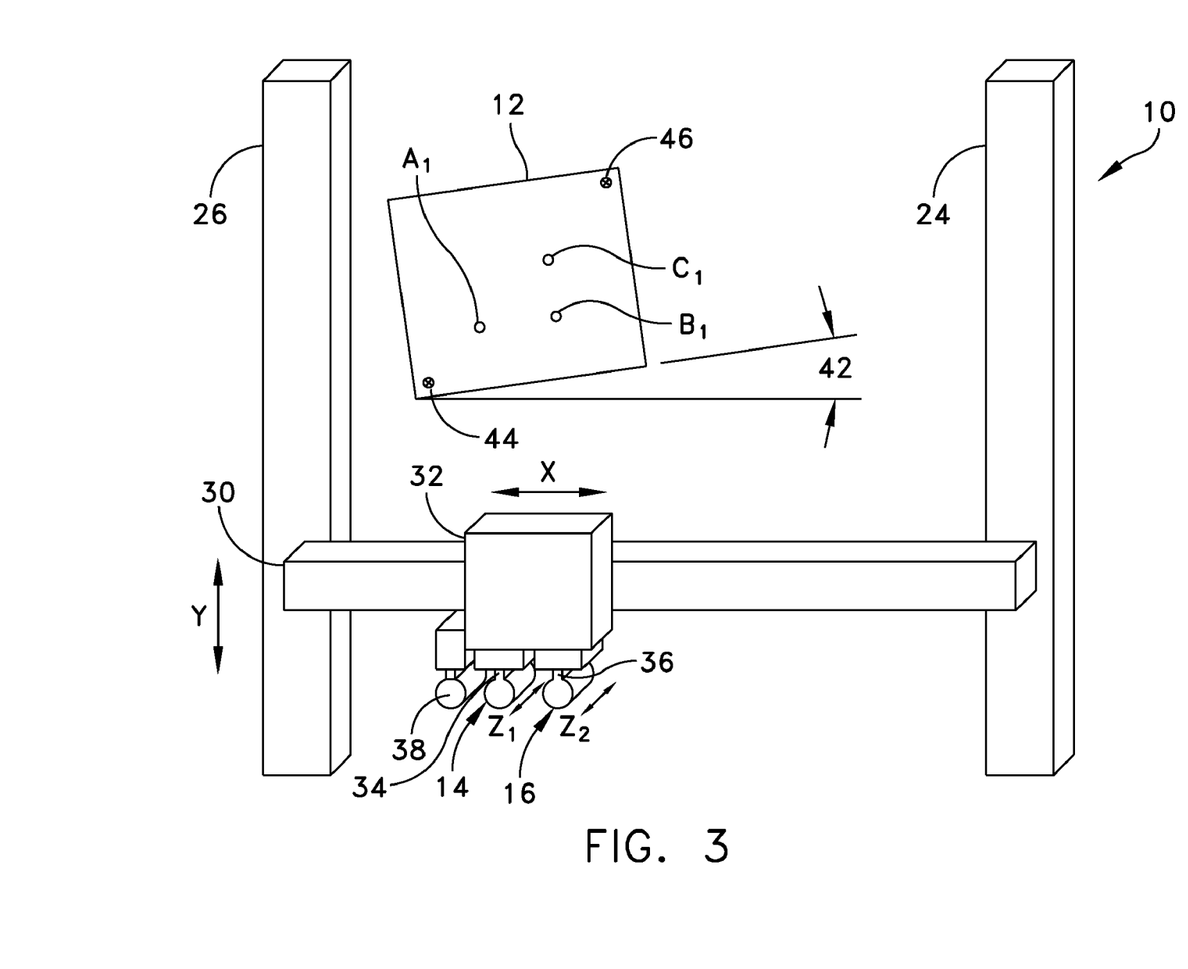
Figure 4:
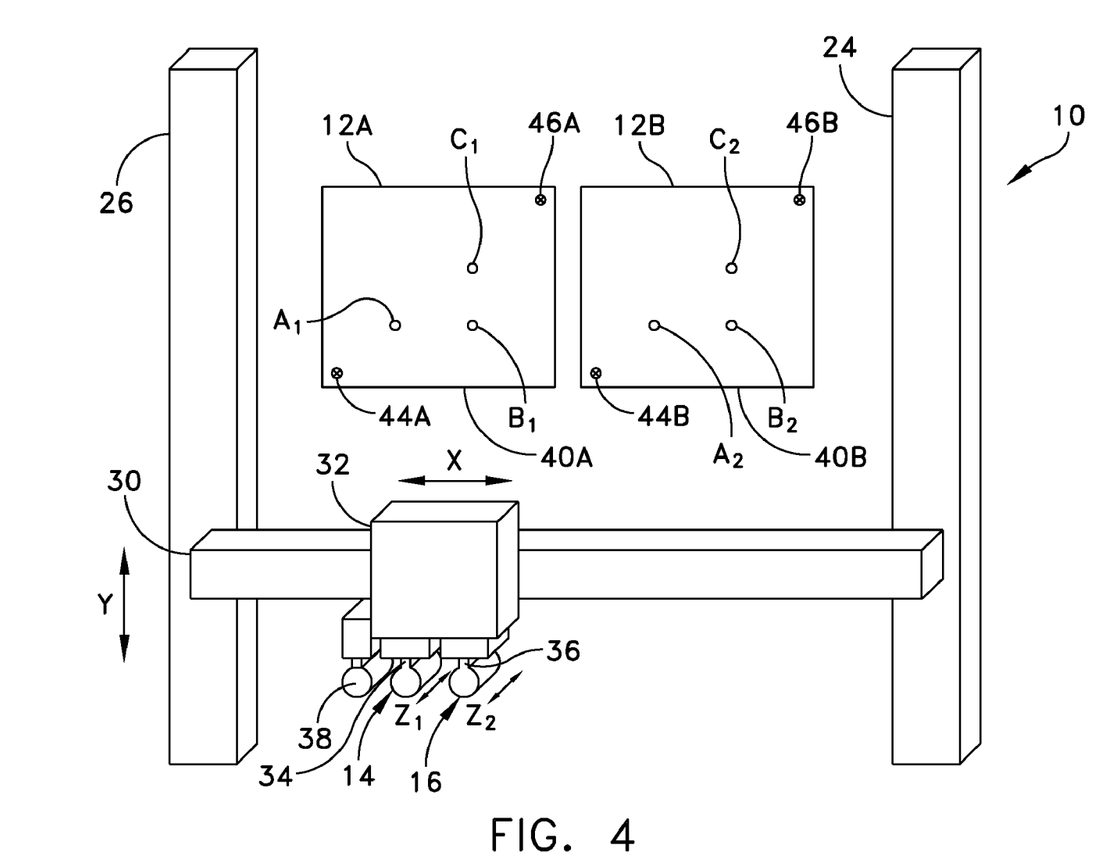

Referring now to FIGS. 2-4, and more particularly to FIG. 2, the gantry 24 may be configured to include a left-hand side rail 26, a right-hand side rail 28 and a beam 30 that extends between the two side rails. The beam 30 is configured to move in a Y axis direction along the side rails 26, 28 to achieve Y axis movement of the dispensing units 14, 16. X axis movement of the dispensing units 14, 16 is achieved by a carriage device 32 mounted on the beam 30. Specifically, the carriage device 32 houses the dispensing units 14, 16 and is configured to move along the length of the beam 30 in the X axis direction to move the dispensing units over desired locations of the substrate 12 positioned on the base 22. In a certain embodiment, movement of the gantry 24 (i.e., movement of the beam 30 and the carriage device 32) in the X-Y plane may be achieved by employing ball screw mechanisms driven by respective motors as is well known in the art.

In one embodiment, the platform dispenser 10 described herein may embody an FX-D® dispensing system sold by Speedline Technologies, Inc. of Franklin, Mass. In another embodiment, the platform dispenser may embody a SMART-STREAM™ dispensing system, which is also sold by Speedline Technologies, Inc.

The dispensing units 14, 16, as mentioned above, are capable of achieving Z axis movement by means of independent Z drive mechanisms, which are designated at 34, 36, respectively, in FIGS. 2-4. The amount of Z axis movement may be determined by measuring the distance between the tip of a needle (not shown) of one of the dispensing units 14 and/or 16 and the substrate 12. When moving, one or both of the dispensing units 14, 16 may be positioned at a nominal clearance height above the substrate 12. The clearance height may be maintained at a relatively consistent elevation above the substrate 12 when moving from one dispense location to another dispense location. Upon reaching a predetermined dispense location, the Z drive mechanism 34, 36 lowers its respective dispensing unit 14, 16 to the substrate so that dispensing of material on the substrate 12 may be achieved.

In certain embodiments, a common gantry that moves both of the dispensing units together may control the dispensing units. Thus, a single Z drive mechanism may be provided. This configuration is particularly suited for dispensing units that stream or launch viscous material onto the circuit board. In one embodiment, the dispensing unit may be of the type disclosed in U.S. patent application Ser. No. 11/707,620, entitled METHOD AND APPARATUS FOR DISPENSING VISCOUS MATERIAL ON A SUBSTRATE, filed Feb. 16, 2007, which claims priority to U.S. Provisional Patent Application Ser. No. 60/856,508, entitled METHOD AND APPARATUS FOR DISPENSING A VISCOUS MATERIAL ON A SUBSTRATE, filed Nov. 3, 2006, both of which are incorporated herein by reference and assigned to the assignee of the present disclosure, Speedline Technologies, Inc. of Franklin, Mass. With the dispensing unit disclosed in the non-provisional and provisional applications, viscous material streams onto the substrate between predetermined starting and stopping points. In another embodiment, the dispensing unit may be of the type disclosed in U.S. Pat. No. 5,747,102, entitled METHOD AND APPARATUS FOR DISPENSING SMALL AMOUNTS OF LIQUID MATERIAL, issued May 5, 1998, which is incorporated herein by reference. With the dispensing unit disclosed in this patent, viscous material is launched at a predetermined location on the substrate. The dispensing units that stream or launch viscous material may be referred to as non-contact dispensing units in which Z axis movement is not required, but may be provided.

In one embodiment, to measure the height of the needle of the dispensing unit at a desired elevation above the circuit board, there is provided a system for measuring the height of the dispenser needle above the circuit board in the Z axis direction. In some height (or distance) measuring systems, physical contact is made between the measuring system and the surface. One such height measuring system is described in U.S. Pat. No. 6,093,251, entitled APPARATUS FOR MEASURING THE HEIGHT OF A SUBSTRATE IN A DISPENSING SYSTEM, which is assigned to the assignee of the present disclosure, and is incorporated herein by reference. Specifically, U.S. Pat. No. 6,093,251 discloses a measuring probe that is extendable between a reference point and a location on the circuit board to measure the height of the substrate.

In other height measuring systems, a laser light source and an optical sensing system are combined to measure the position of an object without making physical contact. An example of a non-contact measuring system is manufactured and distributed by Micro-Epsilon Messtechnik GmbH of Ortenburg, Germany. In other embodiments, the height measuring system can be incorporated to facilitate the measurement of and compensation for variations in the vertical position of the top surface of the circuit board.

Still referring particularly to FIG. 2, the dispensing units 14, 16 are moved over the substrate 12 in such a manner to perform a dispense operation with one or both of the dispensing units. However, prior to dispensing, the position of the substrate 12 with respect to the dispensing units 14, 16 is determined so that accurate dispensing may take place. Specifically, the carriage device 32 includes an optical element or camera 38 that is configured to take an image of the substrate 12. The camera 38 may be referred to herein as a "vision system" or an "imaging system." To align the substrate 12 with the dispensing units 14, 16 and gantry 24, images of at least two fiducials (44, 46) are taken by the camera 38. If the substrate 12 is out of position, the gantry 24 may be manipulated to account for the actual position of the substrate. In one embodiment, the camera 38 may be calibrated to determine camera-to-needle offset distances for each of the dispensing units 14, 16. Alternatively, the operator of the dispenser 50 may program the camera-to-needle offset distances based upon preexisting information.

FIG. 3 illustrates a substrate 12 in an exaggerated skewed position. As shown, the bottom edge 40 of the substrate 12 is at an angle 42 with respect to the X axis. The gantry 24 moves the camera 38 over the substrate 12 to a first position in which the camera takes an image of a first fiducial 44, which is positioned at the lower left-hand corner of the substrate 12 as viewed in FIG. 3. After capturing an image of the first fiducial 44, the gantry 24 moves the camera 38 over the substrate 12 to a second position in which the camera takes an image of a second fiducial 46, which is positioned at the upper right-hand corner of the substrate. Based on the images of the first and second fiducials 44, 46, the controller 18 can manipulate the gantry 24 to perform an accurate dispense operation with either one of the dispensing units. As shown in FIG. 3, dispense operations are performed at locations $A_1$, $B_1$ and $C_1$, for example. However, as can be appreciated, any number of dispense operations may be performed with one or both of the dispensing units 14, 16. For example, instead of dispensing material at certain locations, lines of material may be dispensed on the substrate 12.

Turning to FIG. 4, the dispenser 10 may be configured to perform dispense operations on two substrates 12A, 12B, which may be connected with one another (as with the cell phone configuration described above) or may be positioned separately on the base 22 in a tray, for example. For the substrates 12A, 12B illustrated in FIG. 4, the substrates are each in an aligned or known position. Thus, dispensing operations at locations $A_1$, $B_1$ and $C_1$ on the first substrate 12A with either dispensing unit 14 or 16 or both may be initiated. Once dispensing on the first substrate 12A is finished, the carriage device may be moved along the beam 30 in an X axis direction so that a dispensing operation may take place at locations $A_2$, $B_2$ and $C_2$ on the second substrate 12B with either dispensing unit 14 or 16 or both. Obviously, the movement of the dispensing units 14, 16 is achieved, as discussed above, by moving the beam 30 in the Y axis direction and the carriage device 32 in the X axis direction.

Figure 5:
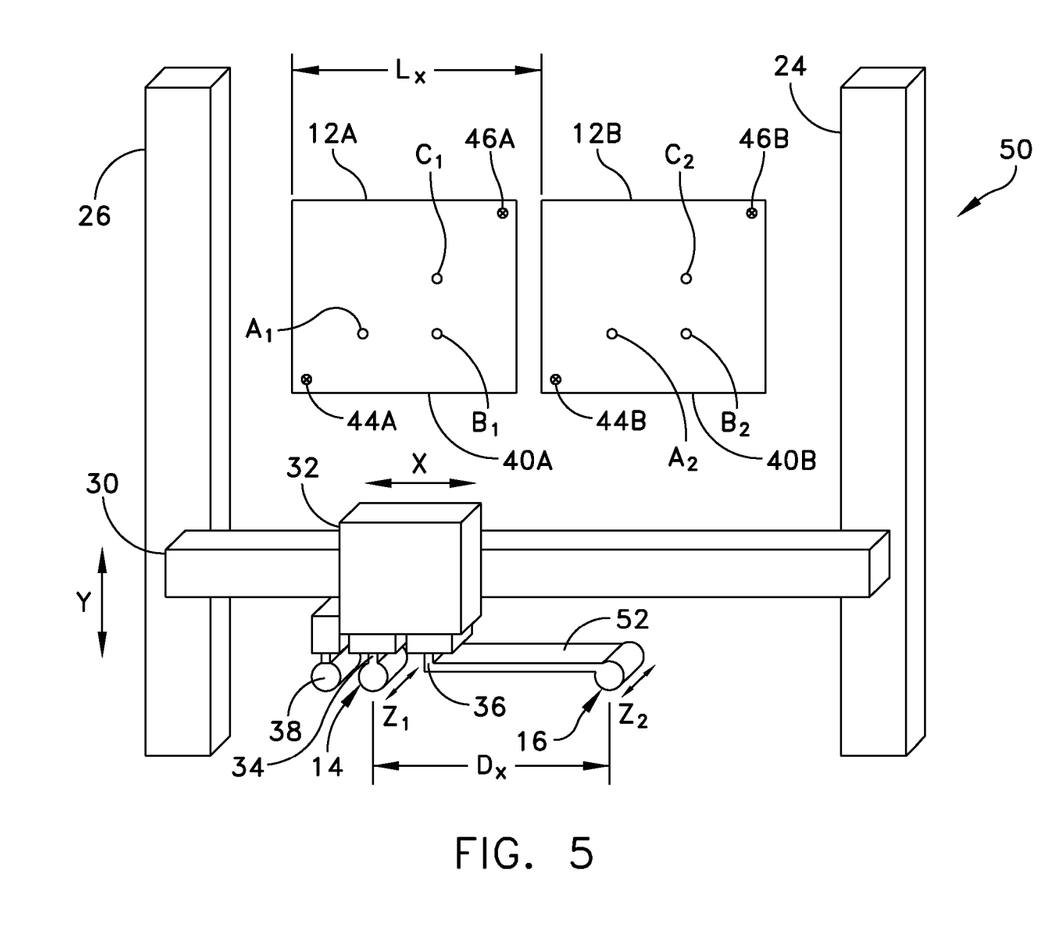
FIGS. 5 and 6 are schematic views of another dispenser of an embodiment of the disclosure used to perform methods of the disclosure.

Referring to FIG. 5, there is generally designated at 50 a dispenser of an embodiment of the disclosure. As shown, the dispenser 50 is similar to dispenser 10 shown in FIGS. 2-4. Accordingly, corresponding reference numerals designate corresponding parts with respect to the dispenser 10 shown in FIGS. 2-4 and the dispenser 50 shown in FIG. 5.

With dispenser 50, the second dispensing unit 16 is coupled to the carriage device by an adjustable bracket 52. Thus, the second dispensing unit 16 may be offset from the first dispensing unit 14 a predetermined distance $D_X$. In a certain embodiment, the bracket 52 may be manipulated to vary or change the distance $D_X$ by any number of mechanisms, such as a telescoping arm or a sliding bracket. In particular, as discussed above, the gantry 24 moves the camera 38 over the substrate 12 to a first position in which the camera takes an image of a first fiducial 44. After capturing an image of the first fiducial 44, the gantry 24 moves the camera 38 over the substrate 12 to a second position in which the camera takes an image of a second fiducial 46. Based on the images of the first and second fiducials 44, 46, the controller 18 can manipulate the gantry 24 to perform an accurate dispense operation with either one of the dispensing units.

For the substrates 12A, 12B illustrated in FIG. 5, the substrates are illustrated in an aligned or known position to begin dispensing operations at locations $A_1$, $B_1$ and $C_1$ on the first substrate 12A, this time with the first dispensing unit 14, for example. Once dispensing on the first substrate 12A is finished with the first dispensing unit 14, instead of moving the carriage device 32 in the X axis direction along the beam 30 as with the dispenser 10 shown in FIGS. 2-4, the carriage device 32 does not require any movement other than to move the second dispensing unit 16 between the locations requiring material.

Specifically, the second dispensing unit 16 is in a suitable position over the second substrate 12B to perform dispensing operations at locations $A_2$, $B_2$ and $C_2$. As shown, the bracket 52 is coupled to the second dispensing unit 16 a predetermined distance $D_X$, which may be manipulated so that it achieves a length that is equivalent to the distance $L_X$ between the first and second substrates. In this particular example, the locations $A_2$, $B_2$ and $C_2$ on the second substrate 12B correspond to the locations $A_1$, $B_1$ and $C_1$ on the first substrate 12A. Again, the movement of the dispensing units 14, 16 is achieved in the X-Y plane, as discussed above, by moving the carriage device 32 in the X axis direction and by moving the beam 30 in the Y axis direction. Z axis movement is achieved by the independent Z drive mechanisms 34, 36 associated with the first and second dispensing units 14, 16, respectively.

Figure 6:
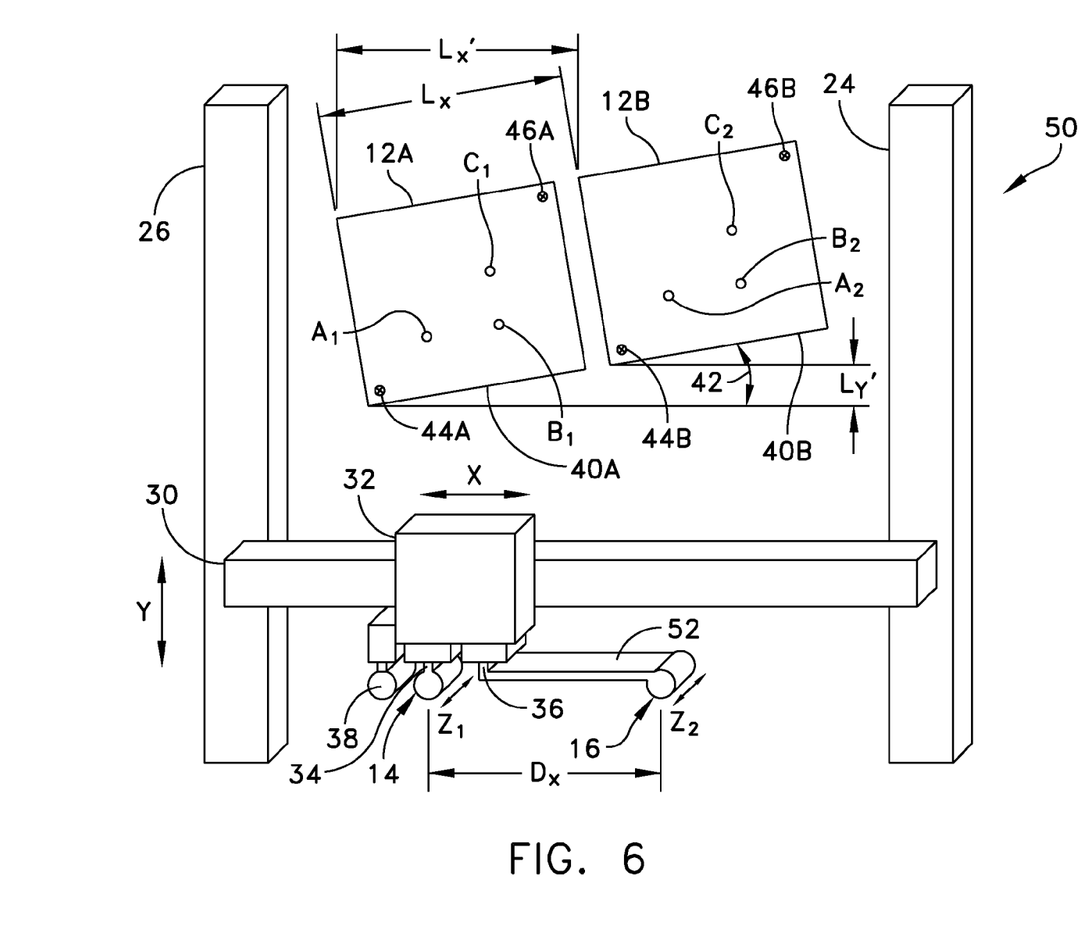

FIG. 6 illustrates the substrates 12A, 12B and dispenser 50 shown in FIG. 5, with the substrates in an exaggerated skewed position. As shown, the bottom edges 40A, 40B of substrates 12A, 12B, respectively, are at an angle 42 with respect to the X axis. To determine the locations or positions of both substrates 12A, 12B, the gantry 24 moves the camera 38 over the first substrate 12A to a first position in which the camera takes an image of a first fiducial 44A of the first substrate 12A, which is positioned at the lower left-hand corner of the first substrate as viewed in FIG. 6. After capturing an image of the first fiducial 44A, the gantry 24 moves the camera 38 over the first substrate 12A to a second position in which the camera takes an image of a second fiducial 46A, which is positioned at the upper right-hand corner of the first substrate.

For the second substrate 12B, the gantry 24 moves the camera 38 over the second substrate to a third position in which the camera takes an image of the third fiducial 44B, which is positioned at the lower left-hand corner of the second substrate. After capturing an image of the third fiducial 44B, the gantry 24 moves the camera 38 over the second substrate 12B to a fourth position in which the camera takes an image of the fourth fiducial 46B, which is positioned at the upper right-hand corner of the second substrate. Based on the images of the first, second, third and fourth fiducials, 44A, 46A, 44B, 46B, respectively, the distance $D_X$ of the second dispensing unit 16 may be manipulated based on the distance $L_X$ between the first and second substrates 12A, 12B. Specifically, the bracket 52 may be manipulated to establish the second dispensing unit 16 a predetermined distance from the first dispensing unit 14.

As shown in FIG. 6, dispense operations are performed at locations $A_1$, $B_1$ and $C_1$ with the first dispensing unit 14 and dispense operations are performed at locations $A_2$, $B_2$ and $C_2$ with the second dispensing unit 16. In one embodiment, dispensing may be achieved by first manipulating the first dispensing unit 14 to dispense material at locations $A_1$, $B_1$ and $C_1$ and then manipulating the second dispensing unit 16 to dispense material at locations $A_2$, $B_2$ and $C_2$. In another embodiment, the first dispensing unit 14 may be manipulated to dispense material at location $A_1$ and then the second dispensing unit 16 may be manipulated to dispense material at $A_2$. Next, the first dispensing unit 14 may be manipulated to dispense material at location $B_1$ and then the second dispensing unit 16 may be manipulated to dispense material at $B_2$. And finally, the first dispensing unit 14 may be manipulated to dispense material at location $C_1$ and then the second dispensing unit 16 may be manipulated to dispense material at $C_2$. Some other dispense sequence may also be performed based on the optimal movements of the first and second dispensing units 14, 16.

Thus, for a dispenser having two dispensing units 14, 16 as shown in FIGS. 5 and 6, based on the determination of the locations of the first, second, third and fourth fiducials, 44A, 46A, 44B, 46B, respectively, the angle of the first and second substrates 12A, 12B with respect to the X axis may be determined. As shown in FIG. 6, the $L_{X1}$ and $L_{Y1}$ offset distances may be determined so that accurate dispense operations may take place. Accordingly, for a dispenser having multiple dispensing units, the distance and relative position of each of the multiple dispensing units may be configured to match the distance and relative spacing between each of the multiple substrates or components. After collecting and analyzing alignment information from an automatic vision alignment system, a first of the multiple dispensing units is positioned over a first dispense location on the first substrate or component. After performing a dispense operation, the gantry may be manipulated to make any required X-Y plane position adjustment that may be necessary to align a second of the multiple dispensing units over the corresponding first dispensing location of the second of the multiple substrates or components. Since the distance and relative position between each of the multiple dispense units is substantially similar to, although not necessarily identical to, the distance and relative position between each of the multiple substrates or components, any such adjustment of the gantry will be very small and thus rapidly performed. Each of the remaining multiple dispense units may be similarly utilized to dispense material at the corresponding first dispense location on each of the remaining substrates or components before any large X and Y gantry motion is required. However, if the number of substrates or components is greater than the number of dispense units, then the gantry may need to be repositioned to complete the dispensing operations on all of the substrates. The method is repeated to dispense each of the second and subsequent dispense locations. It should be understood that steps may be interchanged as may be dictated by either throughout or process improvements.

As discussed above, in one embodiment, the dispensing units 14, 16 may be mounted on separate Z drive mechanisms. This configuration enables the performance of independent operations when appropriate, including but not limited to dispensing, cleaning (as by an automatic needle cleaner, for example), purging and calibration (either the X/Y axes position or the Z axis position). However, it should be noted that the dispenser 50 may be particularly suited for non-contact dispensing, such as the streaming of material from the needle. When configured for non-contact dispensing, the dispensing operation may be performed with the two (or more) dispensing units that are mounted on a single Z drive mechanism.

With this particular configuration, the two dispensing units are both positioned over their respective locations on the two (or more) substrates. Specifically, when positioning the first dispensing unit 14 nearly exactly over a given dispense position on the first substrate 12A, the second dispensing unit 16 is in an approximately correct position over the second substrate 12B. Next, the first dispensing unit 14 performs a first dispense operation on the first substrate 12A. Once completed, the second dispensing unit 16 is moved a minor amount to correct its location over the second substrate 12B so as to enable the performance of a second dispense operation on the second substrate. Since non-contact dispensing does not require a Z axis direction of movement, having the first and second dispensing units 14, 16 mounted on a common Z drive mechanism does not preclude independent dispensing from each of the dispensing units.

As discussed above, when determining the offset distance between multiple substrates, or multiple patterns within a single substrate, the camera 38 may be operated to take images of known reference points, such as fiducials, which are used to determine the offset distance. However, the offset distance may be determined by the operator of the dispenser 10 during the set-up of the dispenser based on known configurations. In addition, as described above, the exact offset distance is not necessary. A more coarse distance may be appropriate. Specifically, while a more precise offset distance would serve to minimize any corrective move required of the second dispensing unit (or the first dispensing unit if the second dispensing unit is first used), an imprecise offset distance would not preclude or otherwise negatively impact a precise second dispense operation. The actual relative distance between the two or more dispensing units may be measured and therefore corrected for inaccuracies in the setting of the offset distance.

In certain embodiments, when dispensing on multiple patterns provided on a single substrate, each pattern may have its own corresponding set of local alignment fiducials. Alternatively, the substrate may have one set of global fiducials used to align the entire substrate and thus the multiple patterns at once. In a typical process program, the locations of many of the dispensing sites are known, generally being defined relative to the alignment fiducial locations. Accordingly, once the actual locations of the fiducials have been measured using the camera 38, the actual positions of the many dispense locations may be calculated, including those locations associated with multiple instances of a repeated pattern. Since each of the multiple dispensing units mounted on the gantry has its own camera-to-needle offset distance, which may be separately learned or calibrated as described above, and since each of the multiple dispensing units may be operated at separate times, the proper position corrections for each and every dispense location may be separately and accurately applied to each of the multiple dispensing units.

It should be observed that the dispenser 50 may be operated to perform dispense operations with multiple dispensing units that operate independently from each other. The camera to needle offset distance may be calibrated by the dispenser, or be selected by the operator of the dispenser. Prior to dispensing, the camera-to-needle offset distances may be determined. Additionally, locations of the first and second dispensing units may be calibrated to determine their respective locations prior to dispensing. Finally, the relative offset distance between each of the dispensing units may be nominally (not precisely) calculated to match the relative pitch between multiple instances of a repeated substrate pattern.

Thus, an exemplary dispense operation for two substrates or for two substrate patterns may consist of the following steps: delivering a first electronic substrate pattern to a dispense position; delivering a second electronic substrate pattern to a dispense position; aligning the first electronic substrate pattern with a first dispensing unit; positioning the second dispensing unit a predetermined distance from the first dispensing unit; dispensing material from the first dispensing unit at desired locations on the first electronic substrate pattern; and dispensing material from the second dispensing unit at desired locations on the second electronic substrate pattern. In certain embodiments, the step of dispensing material from the first dispensing unit may comprise lowering the first dispensing unit toward the first electronic substrate pattern. Similarly, the step of dispensing material from the second dispensing unit may comprise lowering the second dispensing unit toward the second electronic substrate pattern.

Another exemplary dispense operation may consist of the following steps: delivering first and second electronic substrate patterns to respective dispense positions; positioning a first dispensing unit over the first electronic substrate pattern; positioning a second dispensing unit a predetermined distance from the first dispensing unit; dispensing material from the first dispensing unit at desired locations on the first electronic substrate pattern, wherein dispensing material from the first dispensing unit comprises lowering the first dispensing unit toward the first electronic substrate pattern; and dispensing material from the second dispensing unit at desired locations on the second electronic substrate pattern, wherein dispensing material from the second dispensing unit comprises, lowering the second dispensing unit toward the second electronic substrate pattern. In certain embodiments, the predetermined distance is determined by identifying a first point of reference associated with the first electronic substrate pattern and a second point of reference associated with the second electronic substrate pattern.

Yet another exemplary dispense operation for two substrates may consist of the following steps: (1) calibrating the actual distance between each of the dispensing units and the camera; (2) identifying the actual positions of the fiducial locations on a substrate or on multiple substrates; (3) moving the first dispensing unit to a first dispense location on a first substrate; (4) dispensing at the first dispense location on the first substrate; (5) moving the second dispensing unit to the first dispense location on the second substrate, which is a small and therefore rapidly performed movement; (6) dispensing at the first dispense location on the second substrate; and (7) repeating steps (3) through (6) for each of the remaining dispense locations on the substrates. The foregoing operation may be performed when dispensing on a single substrate having multiple patterns on the substrate.

In other embodiments of the disclosure, a dual-lane conveyor is incorporated into the system to handle work pieces. In such systems, the dispense units continue to dispense on parts fixed on one conveyor lane while parts are loaded off of and onto another conveyor lane.

In still other embodiments of the disclosure, aspects of the dual-lane conveyor are incorporated into multiple pallet loading fixtures. In such systems, the dispense units continue to dispense on parts fixed on one pallet while parts are loaded off of and then onto another pallet.

In another example, reference may be made to FIG. 5. Specifically, when the substrates 12A, 12B are aligned, or in the form of multiple, identical patterns that are aligned with one another on the substrate, such with cell phone patterns, rather than engaging the first dispensing unit to dispense on the first substrate 12A and then the second dispensing unit 16 to dispense on the second substrate 12B, the first and second dispensing units 14, 16 may be operated simultaneously. Thus, with respect to the two substrates 12A, 12B shown in FIG. 5, the first and second dispensing units 14, 16 may be moved by the beam 30 and the carriage device 32 over locations $A_1$ and $A_2$, respectively, to dispense on these locations of respective substrates 12A and 12B. After material is dispensed, the beam 30 and the carriage device 32 may operated to move the first and second dispensing units 14, 16 over locations $B_2$ and $B_2$, respectively, for performing dispense simultaneous operations on these locations. This process may be repeated for each location until all of the locations on the substrates 12A and 12B requiring material are dispensed upon.

As mentioned above, the bracket 52 is coupled to the second dispensing unit 16 a predetermined distance $D_X$, which may be extended and retracted so that it achieves a length that is equivalent to the distance $L_X$ between the first and second substrates. In a certain embodiment, the second dispensing unit 16 may be manually preset to a desired position. In other embodiments, the second dispensing unit 16 may be automatically adjusted by a suitable mechanism provided on the bracket 52. As with the prior example, in this particular example, since the patterns on the first and second substrates 12A, 12B are identical, the locations $A_2$, $B_2$ and $C_2$ on the second substrate 12B correspond to the locations $A_1$, $B_1$ and $C_1$ on the first substrate 12A so that the movement of the dispensing units 14, 16 places the dispensing units above corresponding locations on the substrates. Z axis movement may be achieved by the independent Z drive mechanisms 34, 36 associated with the first and second dispensing units 14, 16, respectively.

In one embodiment, the camera 38 is configured to capture an image of a first pattern (e.g., a fiducial or a pattern landmark on substrate 12A) and to capture an image of a second pattern (e.g., a fiducial or a pattern landmark on substrate 12B). The camera 38 may take one or more images of the substrate in order to obtain sufficient information as to whether the first and second patterns are aligned with one another. After taking the image or images, the controller 18 is configured to verify whether the first pattern and the second pattern are properly positioned on the support with respect to one another based on the image. If properly positioned, the dispensing units 14, 16 may be controlled by the controller 18 to perform simultaneous dispense operations of the first dispensing unit on the first pattern and the second dispensing unit on the second pattern. As mentioned above, the dispensing units may be non-contact-type dispensing units that are capable of streaming or launching material onto the substrate.

In the situation where the two patterns are not properly positioned, the dispenser may operate in the manner described above. For example, the first dispensing unit 14 may perform all of the dispense operations on the first pattern. After completing the first pattern, the first dispensing unit 14 or the second dispensing unit 16 may perform all of the dispense operations on the second pattern. In another example, the first dispensing unit 14 may perform some of the dispense operations on a first area of the first pattern. Next, the second dispensing unit 16 may perform some of the dispense operations on a first area of the second pattern. After completing the first areas of the first and second patterns, the first and second dispensing units may sequentially dispense material on subsequent areas of the first and second patterns in the manner described above.

In further examples, the substrate may include three or more patterns may be provided, or three or more separate substrates may be provided. With either example, the camera 38 may be configured to capture images of each pattern as described above. After taking the images, the controller 18 may be configured to determine whether the patterns are sufficiently aligned for simultaneous dispensing. In one embodiment, the dispenser may be configured with any number of dispensing units to dispense on the patterns. In other embodiments, the dispenser may be configured with two dispensing units as disclosed above, with one dispensing unit (e.g., dispensing unit 14) dispensing on the first pattern and the other dispensing unit (e.g., dispensing unit 16) simultaneously dispensing on the third pattern. This approach may be particularly desirable when adjacent patterns are positioned too close to one another, thereby prohibiting the dispensing units from being able to operate over adjacent patterns due to the relatively large sizes of the dispensing units. Once dispensing on the first and third patterns is completed, the dispenser may be configured to move the dispensing units such that the first dispensing unit 14 is positioned over the second pattern and the second dispensing unit 16 is positioned over the fourth pattern, if provided. This sequence of operation may continue until dispensing operations are performed on all of the patterns. For an odd number of patterns, the first dispensing unit 14 may be configured to dispense material on the last pattern, while the second dispensing unit 16 remains stationary.

It is further contemplated that when using more than two dispensing units, that this approach of simultaneous dispensing on every other pattern may be employed. For example, when using three dispensing units, the first, third and fifth patterns may be dispensed upon simultaneously by the first, second and third dispensing units, respectively. After dispensing on these patterns, the dispensing units may be moved so that dispensing occurs on the second, fourth and sixth patterns with the first, second and third dispensing units, respectively.

In an exemplary embodiment, a method of dispensing material may include delivering an electronic substrate to a dispense position, the electronic substrate having at least two identical patterns, capturing at least one image of the at least two patterns, determining whether the at least two patterns are properly positioned to perform simultaneous dispense operations on the at least two patterns based on the captured image, and performing simultaneous dispense operations on the at least two patterns if the two patterns are properly positioned.

Dispensing material may include positioning a first dispensing unit over a first location of a first pattern and positioning a second dispensing unit over a first location of a second pattern. As discussed above, the second dispensing unit may be spaced from the first dispensing unit a predetermined distance. Specifically, material may be dispensed from the first and second dispensing units on respective first locations of the first and second patterns. Once dispensing takes place, the first dispensing unit is moved over a second location of the first pattern and the second dispensing unit is simultaneously moved over a second location of the second pattern of the electronic substrate. Once moved, material may be dispensed from the first and second dispensing units on respective second locations of the first and second patterns.

In another exemplary embodiment, a method of dispensing material may include (1) identifying positions of more than one location on an electronic substrate, (2) determining whether a dispense location of a first pattern and a dispense location of a second pattern are properly positioned to perform simultaneous dispense operations on the first and second patterns based on the identified positions, (3) moving a first dispensing unit to a dispense location on the first pattern and a second dispensing unit to a dispense location on the second pattern, the dispense location of the first pattern corresponding with the dispense location on the second pattern, (4) dispensing at the first dispense location on the first pattern with the first dispensing unit and at the first dispense location on the second pattern with the second dispensing unit, and (5) repeating steps (3) and (4) for each remaining dispense location on the first and second patterns of the electronic substrate. As discussed above, prior to performing the method, a distance between the first dispensing unit 14 and the camera 38 and the distance between the second dispensing unit 16 and the camera 38 may be calibrated.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A method of dispensing material comprising:
   delivering an electronic substrate to a dispense position, the electronic substrate having at least two identical patterns;
   capturing at least one image of the at least two patterns; and
   determining whether the at least two patterns are properly positioned to perform simultaneous dispense operations on the at least two patterns based on the captured image.

2. The method of claim 1, wherein if the at least two patterns are not properly positioned, performing a first dispense operation on a first pattern of the at least two patterns and performing a second dispense operation on a second pattern of the at least two patterns.

3. The method of claim 2, wherein the second dispense operation is performed after the first dispense operation.

4. The method of claim 1, wherein if the at least two patterns are properly positioned, performing simultaneous dispense operations on the at least two patterns.

5. The method of claim 4, further comprising positioning a first dispensing unit over a first location of a first pattern and positioning a second dispensing unit over a first location of a second pattern, and performing dispense operations with the first and second dispensing units.

6. The method of claim 5, wherein the second dispensing unit is spaced from the first dispensing unit a predetermined distance.

7. The method of claim 5, further comprising dispensing material from the first and second dispensing units on respective first locations of the first and second patterns.

8. The method of claim 5, further comprising simultaneously moving the first dispensing unit over a second location of the first pattern and the second dispensing unit over a second location of the second pattern of the electronic substrate, and dispensing material from the first and second dispensing units on respective second locations of the first and second patterns.

9. The method of claim 5, wherein dispensing material from the first dispensing unit comprises lowering the first dispensing unit toward the first pattern.

10. The method of claim 9, wherein dispensing material from the second dispensing unit comprises lowering the second dispensing unit toward the second pattern.

11. A method of dispensing material comprising:
    delivering an electronic substrate to a dispense position, the electronic substrate having at least two identical patterns;
    capturing at least one image of the at least two patterns; and
    determining whether the at least two patterns are properly positioned to perform simultaneous dispense operations on the at least two patterns based on the captured image;
    wherein if the at least two patterns are not properly positioned, performing a first dispense operation on a first pattern of the at least two patterns and performing a second dispense operation on a second pattern of the at least two patterns, the second dispense operation being performed after the first dispense operation, and
    wherein if the at least two patterns are properly positioned, performing simultaneous dispense operations on the at least two patterns.

12. The method of claim 11, further comprising positioning a first dispensing unit over a first location of a first pattern and positioning a second dispensing unit over a first location of a second pattern, and performing dispense operations with the first and second dispensing units.

13. The method of claim 12, wherein the second dispensing unit is spaced from the first dispensing unit a predetermined distance.

14. The method of claim 12, further comprising dispensing material from the first and second dispensing units on respective first locations of the first and second patterns.

15. The method of claim 12, further comprising simultaneously moving the first dispensing unit over a second location of the first pattern and the second dispensing unit over a second location of the second pattern of the electronic substrate, and dispensing material from the first and second dispensing units on respective second locations of the first and second patterns.

16. The method of claim 12, wherein dispensing material from the first dispensing unit comprises lowering the first dispensing unit toward the first pattern.

17. The method of claim 16, wherein dispensing material from the second dispensing unit comprises lowering the second dispensing unit toward the second pattern.

* * * * *